United States Patent
Abhijeet et al.

(10) Patent No.: US 10,067,998 B2
(45) Date of Patent: Sep. 4, 2018

(54) DISTRIBUTED SYNC LIST

(71) Applicant: International Business Machines Corporation, Armonk, NY (US)

(72) Inventors: Kumar Abhijeet, Chicago, IL (US); Andrew D. Baptist, Mt. Pleasant, WI (US); Asimuddin Kazi, Naperville, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 28 days.

(21) Appl. No.: 15/418,909

(22) Filed: Jan. 30, 2017

(65) Prior Publication Data

US 2017/0140018 A1 May 18, 2017

Related U.S. Application Data

(63) Continuation-in-part of application No. 15/058,408, filed on Mar. 20, 2016.
(Continued)

(51) Int. Cl.
*G11C 29/00* (2006.01)
*G06F 17/30* (2006.01)
(Continued)

(52) U.S. Cl.
CPC ........ *G06F 17/30578* (2013.01); *G06F 3/065* (2013.01); *G06F 3/067* (2013.01);
(Continued)

(58) Field of Classification Search
CPC ............. G06F 17/30578; G06F 3/0619; G06F 3/0644; G06F 3/065; G06F 3/067; G06F 11/1076; H03M 13/1515
See application file for complete search history.

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Sam Rizk
(74) *Attorney, Agent, or Firm* — Garlick & Markison; Timothy W. Markison; Edward J. Marshall

(57) ABSTRACT

A dispersed storage network (DSN) includes a processing unit and multiple storage unit sets. A first storage unit set and a second storage unit set receive, sets of encoded data slices generated, by the DS processing unit, for storage. The encoded data slices include dispersal-encoded portions of one or more data objects. The first and second storage unit sets are used to mirror storage of the one or more data objects. The first storage unit set stores data slices unsynchronized to the second storage unit set, and generates a record identifying the unsynchronized data slices. Later, the storage unit detects that the availability of at least one storage unit of the second storage unit set, and in response facilitates copying of particular unsynchronized data slices to corresponding storage units of the second storage unit set. After copying, the record is updated to indicate the synchronization.

20 Claims, 7 Drawing Sheets

Related U.S. Application Data

(60) Provisional application No. 62/154,886, filed on Apr. 30, 2015.

(51) Int. Cl.
  *G06F 3/06* (2006.01)
  *G06F 11/10* (2006.01)
  *H03M 13/15* (2006.01)

(52) U.S. Cl.
  CPC .......... *G06F 3/0619* (2013.01); *G06F 3/0644* (2013.01); *G06F 11/1076* (2013.01); *H03M 13/1515* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, II et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 1511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

distributed, or dispersed, storage network (DSN) 10

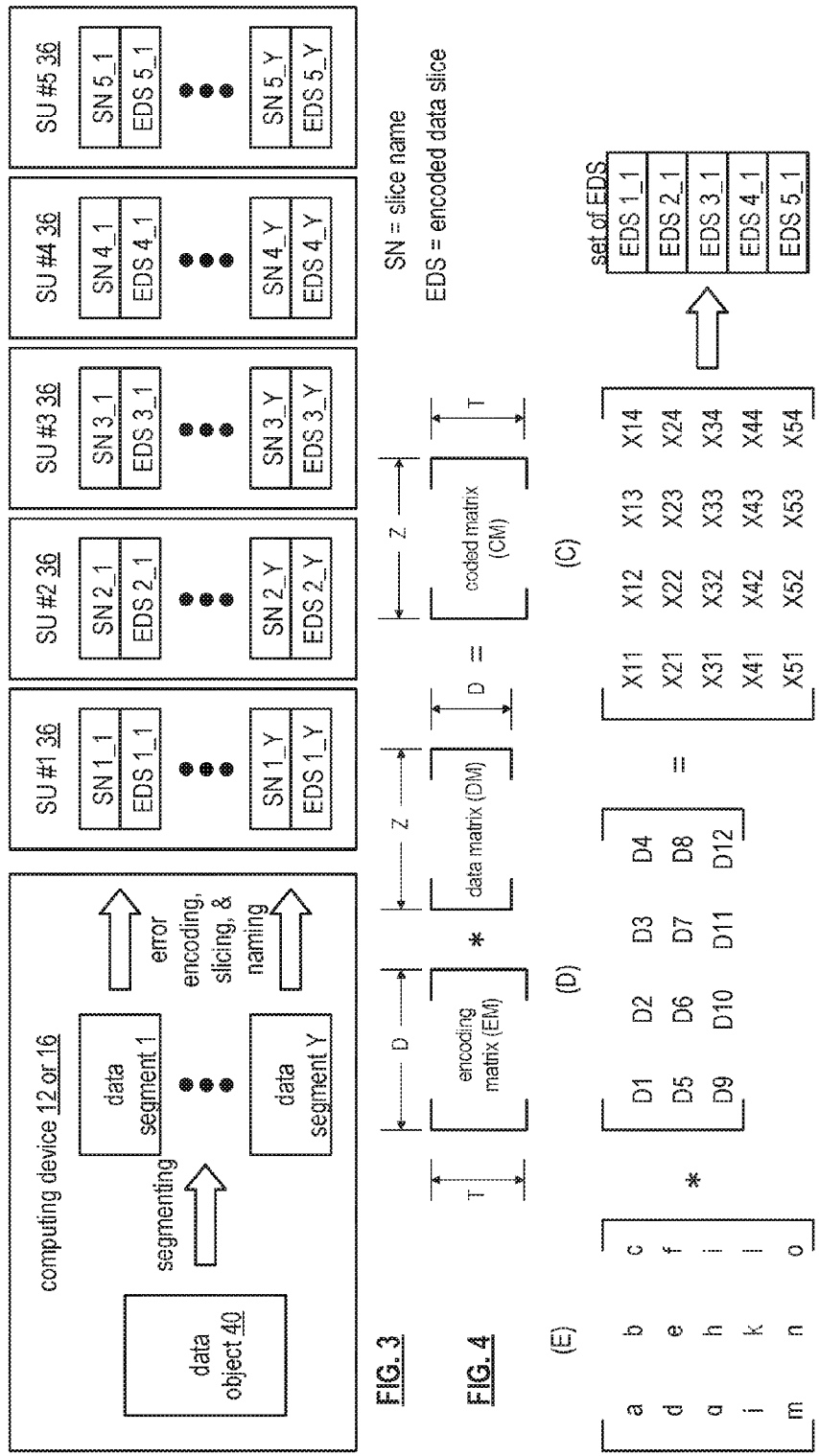

DISTRIBUTED SYNC LIST

CROSS-REFERENCE TO RELATED APPLICATIONS

The present U.S. Utility Patent Application claims priority pursuant to 35 U.S.C. § 120 as a continuation-in-part of U.S. Utility application Ser. No. 15/058,408, entitled "ACCESSING COMMON DATA IN A DISPERSED STORAGE NETWORK," filed Mar. 2, 2016, which claims priority pursuant to 35 U.S.C. § 119(e) to U.S. Provisional Application No. 62/154,886, entitled "BALANCING MAINTENANCE AND ACCESS TASKS IN A DISPERSED STORAGE NETWORK," filed Apr. 30, 2015, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In a distributed storage configuration using multiple devices located at different sites for redundancy, one of the storage sites may be down for a sustained period of time. Conventional techniques may not be able to adequately keep track of every single data object for which no redundancy exits for the entire time the site is down, especially if the distributed storage system is undergoing a high, sustained load of a large number of objects. Without a complete list of every non-redundant data object, a complete rebuild of the "redundant" data may be needed once the inoperable storage site becomes available again.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
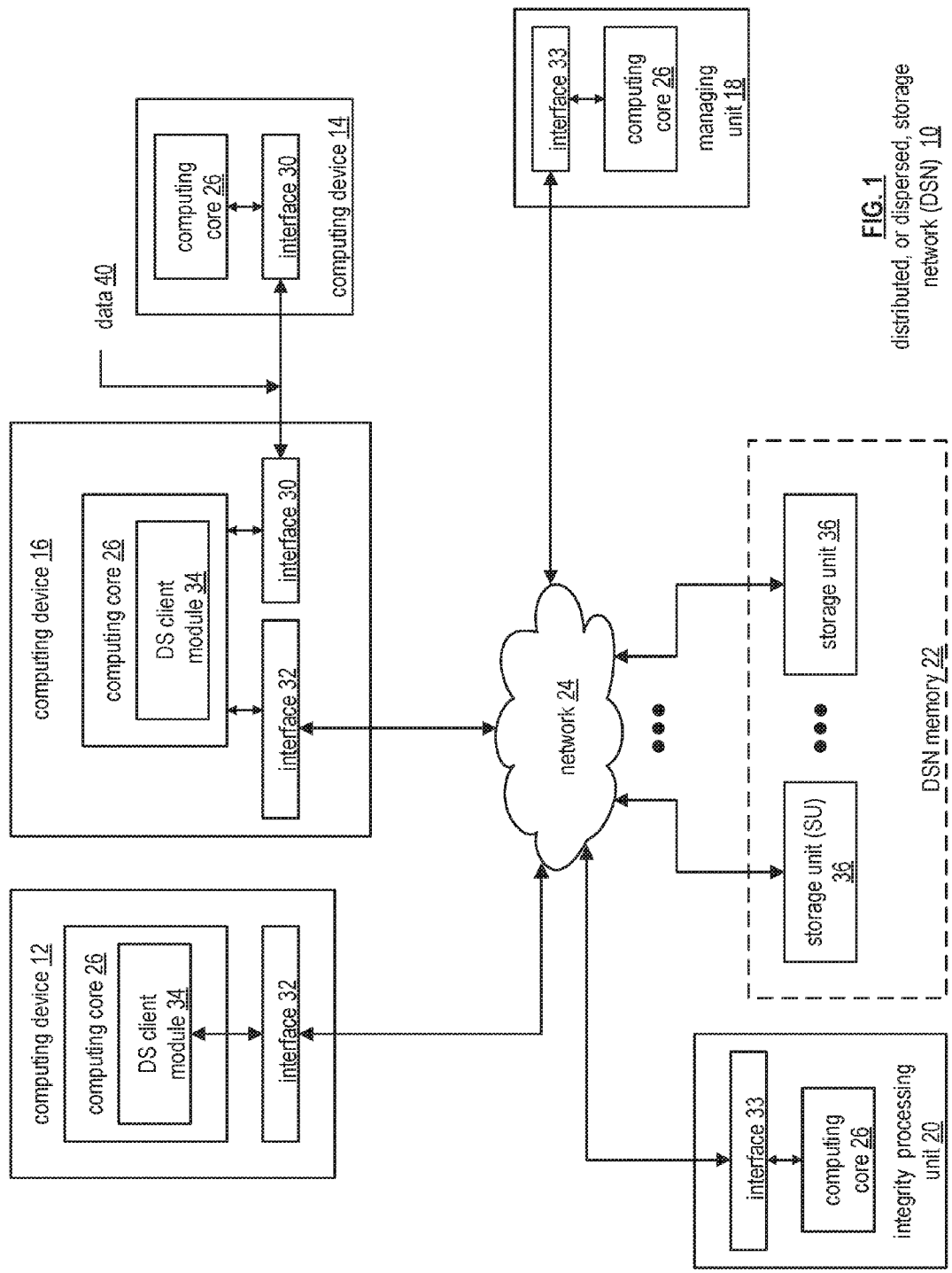
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
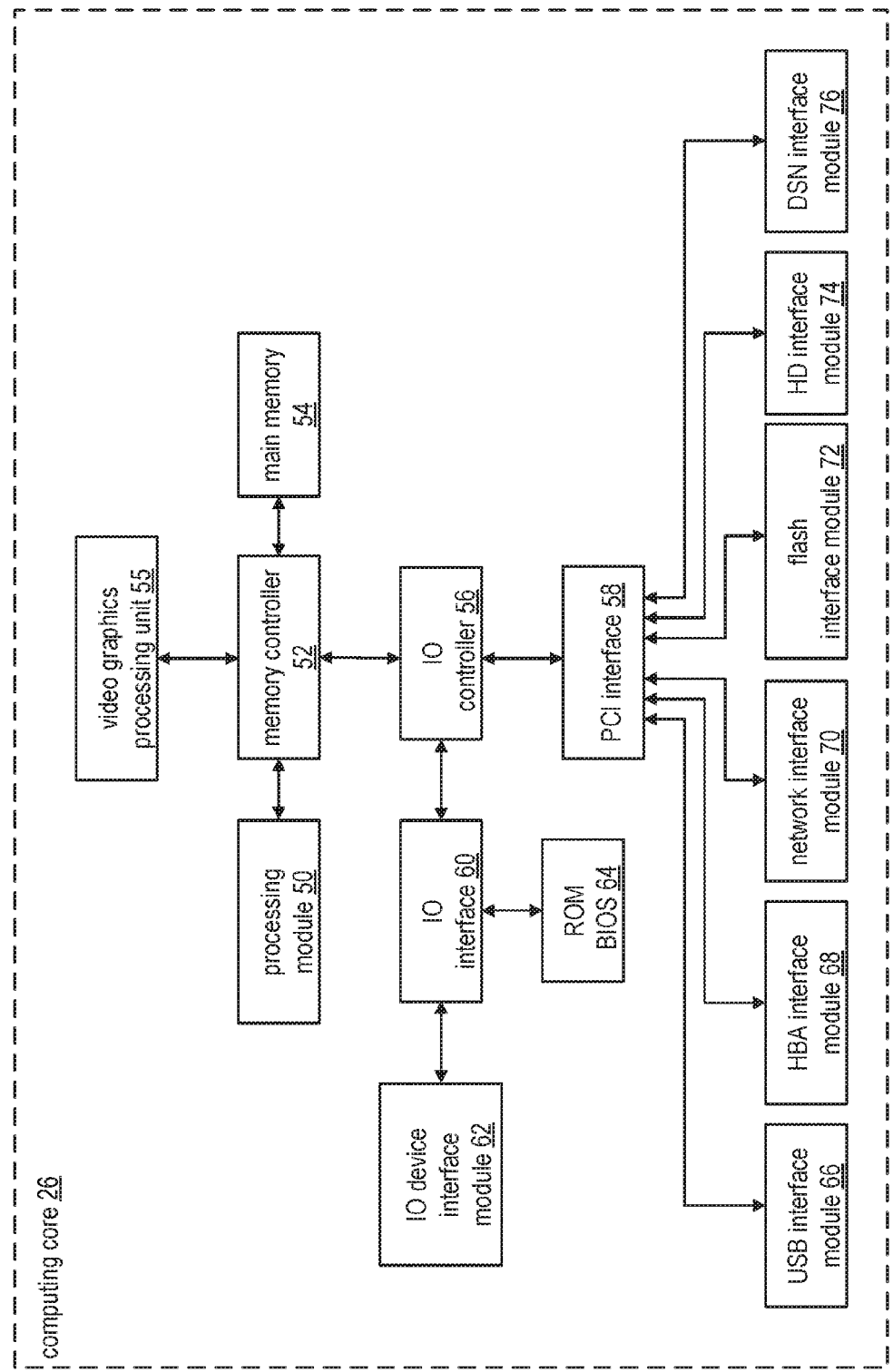
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
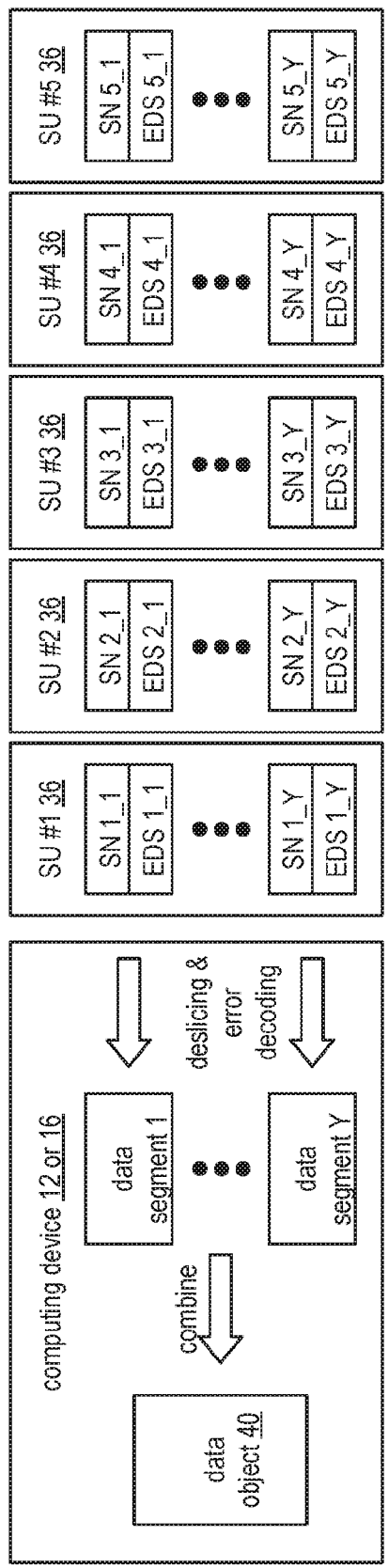
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
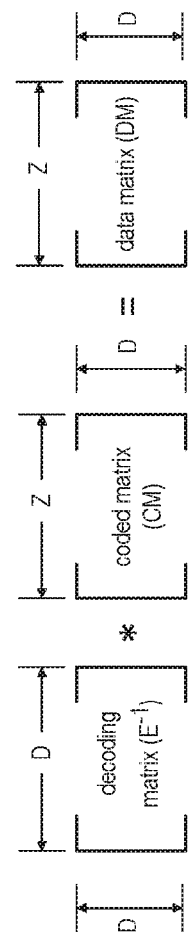
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
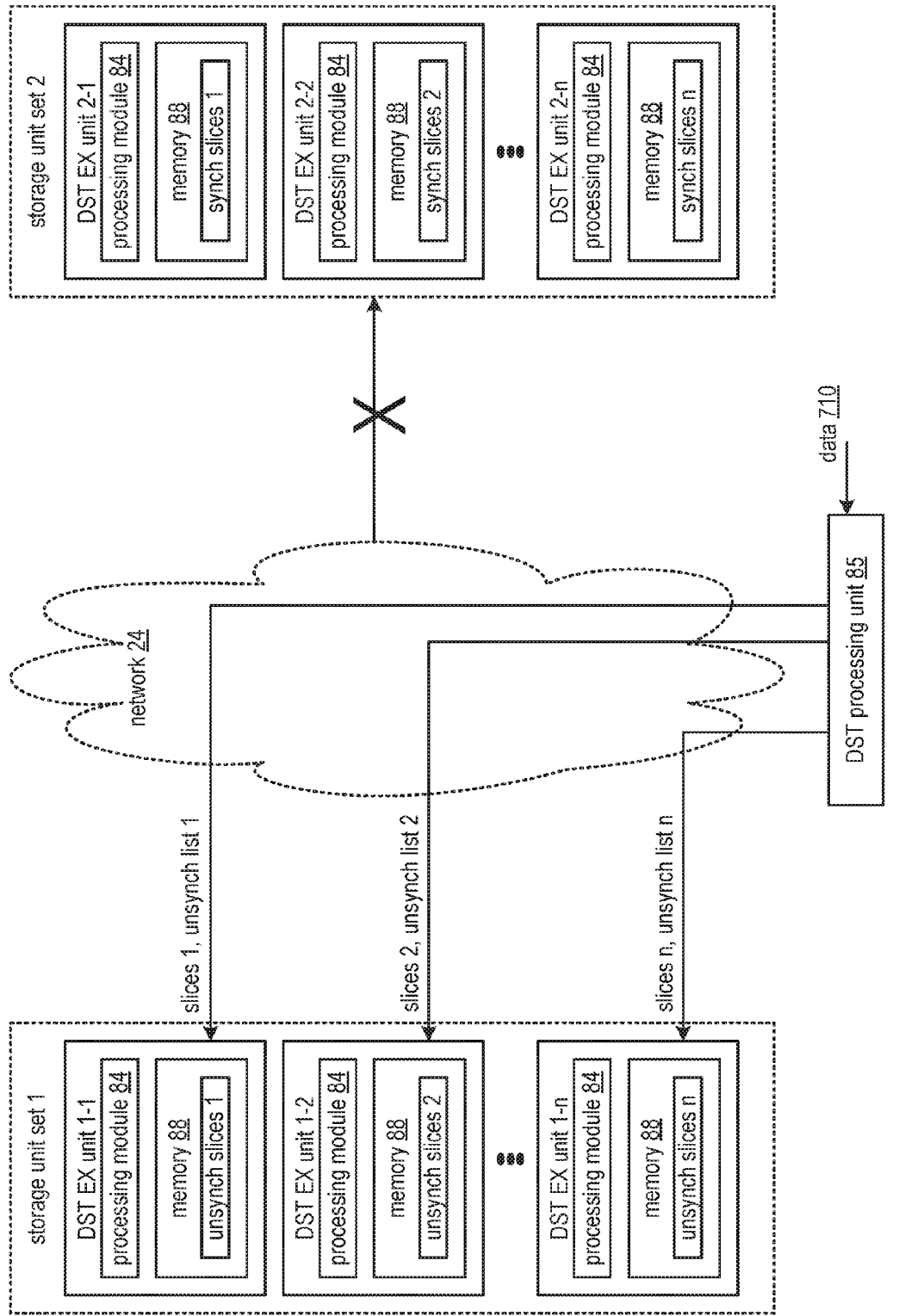
FIGS. 9 and 10 are a schematic block diagram of another embodiment of a dispersed storage network (DSN) in accordance with the present invention.
Figure 10:
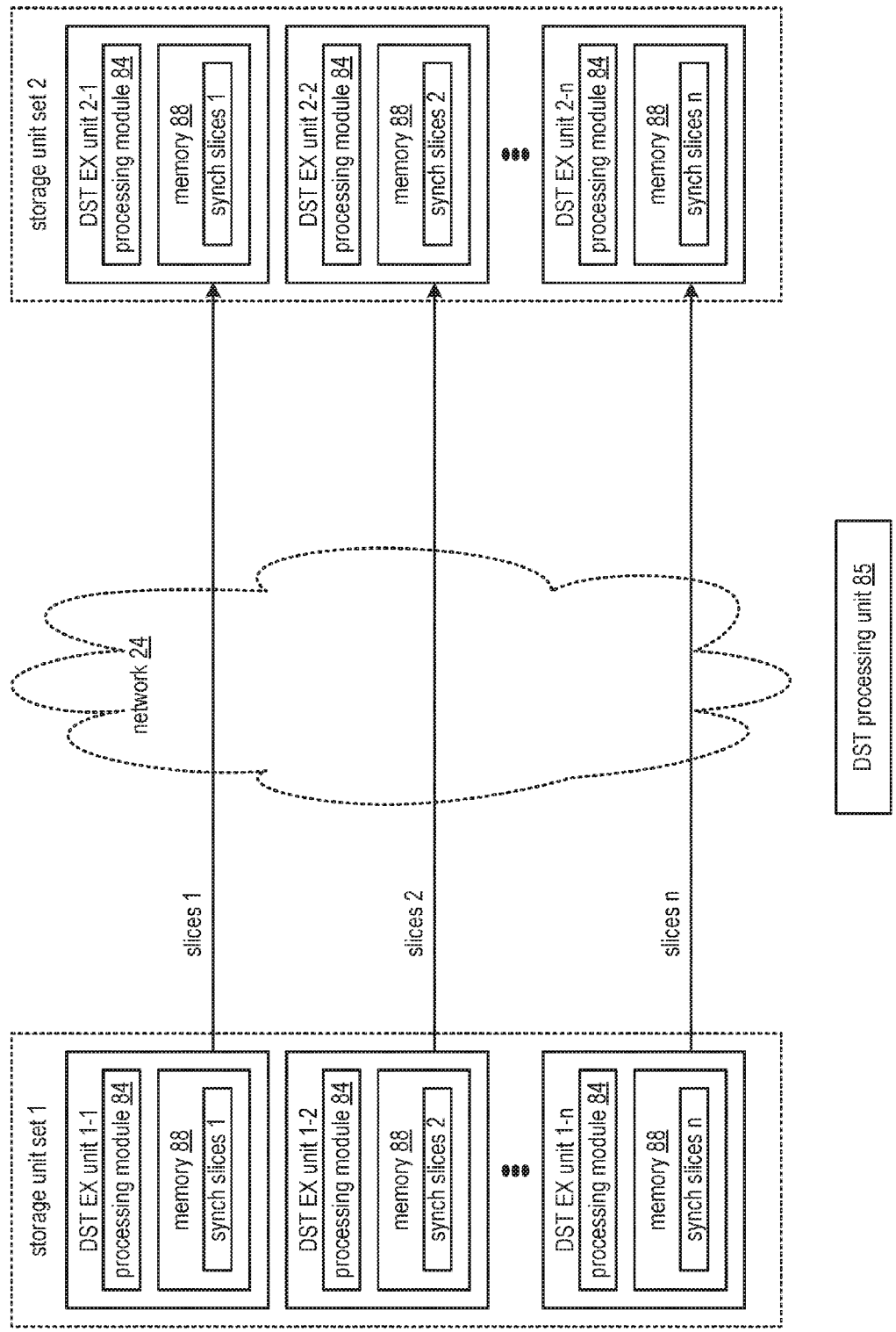
Figure 11:
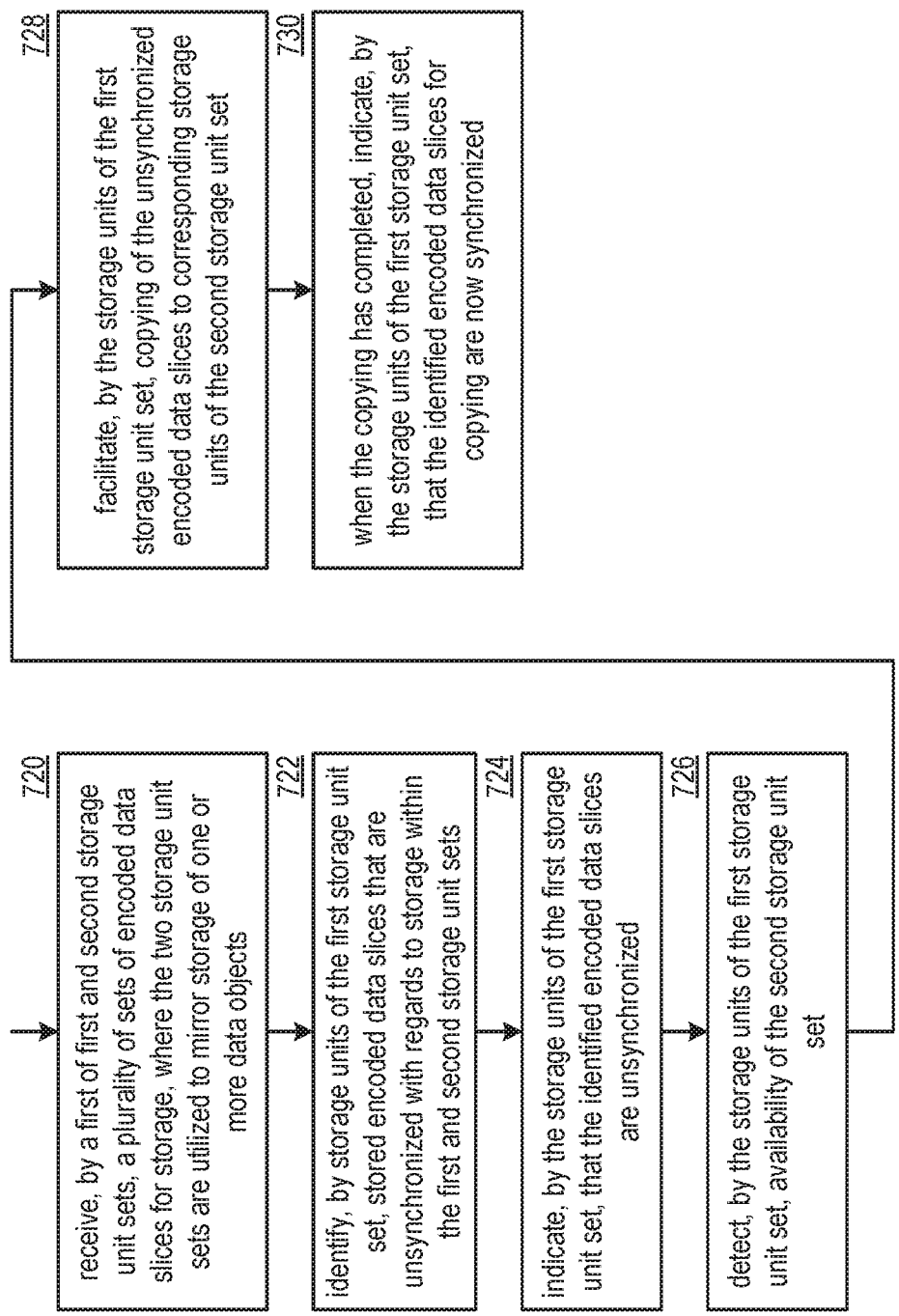
FIG. 11 is a flowchart illustrating an example of synchronizing mirroring of stored data in accordance with the present invention.

Referring next to FIGS. 9-11, various embodiments of a distributed storage system employing a distributed synchronization list will be discussed. Some such embodiments are particularly useful in a multi-site memory configuration. For example, in a two-site configuration, a processing unit, when instructed to write a given object, attempts to write the object to two or more vaults at two different locations. However, if at least one site is down for a sustained period of time, then the processing unit can attempt to maintain a local record of the objects it failed to sync, which will allow it to more rapidly recover once availability is restored. This can be difficult in situations where the processing unit is undergoing a high sustained load of a large number of objects, and the processing unit may not be able to keep a local record of everything it failed to sync.

To prevent this, some strategies include: writing the list of objects failed to sync to a dispersed data structure, e.g. a queue, index, map, etc.), or distributing the list of objects to individual storage units. For example, in a system with 48 storage units, assume that the processing unit can only remember the last hours' worth of objects written. In some implementations, the storage units together can assist in remembering the past 48 hours of objects written, by each remembering an hour's worth of objects, assuming comparable spare memory resources of the storage units and the processing unit. Distributing the task of remembering the list of non-synchronized objects can accelerate the recovery of the system, because upon the return of availability of the down site, a complete listing of what objects need to be synced is already known by all the ds units. Furthermore, the ds units in possession in their fraction of the list may begin to work immediately on processing the sync operation for the items in their list.

FIGS. 9 and 10 are a schematic block diagram of another embodiment of a dispersed storage network (DSN) that includes a storage unit set 1, which can in some embodiments be an instance of DSN memory 22 of FIG. 1; a distributed storage and task (DST) processing unit 85, such as computing device 16 of FIG. 1, the network 24 of FIG. 1, and a storage unit set 2. The storage unit set 1 includes a set of DST execution units 1-1 through 1-n and the storage unit set 2 includes another set of DST execution units 2-1 through 2-n. Each DST execution unit can be an instance of storage unit 36 of FIG. 1, and can include processing module 84, which can be an instance of computing core 26 of FIG. 2, and memory 88. The DSN functions to synchronize mirroring of stored data 710.

FIG. 9 illustrates steps of an example of operation of the synchronizing of the mirroring of the stored data 710 where the storage unit set 1 receives one or more sets of encoded data slice for storage, where two or more storage unit sets that includes the storage unit set 1 are utilized to mirror storage of one or more data objects. The receiving includes the DST processing unit 85 dispersed storage error encoding the data 710 to produce the one or more sets of encoded data slices 1-n and initiate sending, via the network 24 of FIG. 1, of the one or more sets of encoded data slices 1-n to the two or more storage unit sets. The sending may further include sending, to each storage unit, a list of unsynchronized encoded data slices associated with the storage unit (e.g., slice names of unsynchronized encoded data slices 1 associated with the first storage units of each storage unit set). Only the storage unit set 1 receives the set of encoded data slices when the storage unit set 2 is temporarily unavailable.

Having received the one or more sets of encoded data slices, the storage units of the storage unit set 1 determines that the received one or more sets of encoded data slices are unsynchronized with regards to storage of the one or more sets of encoded data slices in the storage unit set 2. The determining may be based on one or more of receiving the unsynchronized lists, by default, detecting that a timeframe has expired without receiving confirmation of storage by another storage unit set, and detecting on availability of the other storage unit set. The determining may further include indicating that the one or more sets of encoded data slices are unsynchronized by indicating an unsynchronized status for each encoded data slice and/or indicating an unsynchronized status for an identifier of the data object.

FIG. 10 illustrates further steps of the example of operation of the synchronizing of the mirroring of the store data where a storage unit of the storage unit set 1 detects availability of the other storage unit set. The detecting includes at least one of receiving an availability indicator, interpreting a query response, and interpreting an error message. For example, the DST execution unit 1-1 detects availability of the DST execution unit 2-1 based on a query response.

Having detected the availability of the other storage unit, the storage unit facilitates transfer of unsynchronized encoded data slices from the storage unit to a corresponding storage unit of the other storage unit set. The transferring includes one or more of interpreting a list of unsecured slices, interpreting a list of unsynchronized data objects, identifying the unsynchronized encoded data slices for transfer, initiating transfer of the identified unsynchronized encoded data slices from the storage unit to the corresponding storage unit. For example, the processing module 84 of the DST execution unit 1-1 and retrieves the unsynchronized encoded data slices 1 from the memory 88 and sends, via the network 24 of FIG. 1, the encoded data slices 1 to the DST execution unit 2-1 for storage, where the processing module 84 of the DST execution unit 2-1 stores the encoded data slices 1 as synchronize encoded data slices 1 in the memory 88 of the DST execution unit 2-1. In a similar fashion the other storage units transfer further unsynchronized slices from the storage unit set 1 to the storage unit set 2 to achieve the mirroring.

When the transfer has completed, the storage units of the storage unit set 1 indicate that the previously unsynchronized encoded data slices for transfer are now synchronized. For example, the DST execution units 1-1 through 1-D indicate storage of synchronized encoded data slices 1-n in the storage unit sets 1 and 2. The indicating may further include updating one or more of the list of data object identifiers, the list of encoded data slices, and synchronize/unsynchronized flags associated with the encoded data slices.

FIG. 11 is a flowchart illustrating an example of synchronizing mirroring of stored data. The method includes block 720 where a first of first and second storage unit sets receives a plurality of sets of encoded data slices for storage, where the two storage unit sets are utilized to mirror storage of one or more data objects. The method continues at block 722 where the storage units of the first storage unit set identify the stored encoded data slices that are unsynchronized with regards to storage within the first and second storage unit sets. The identifying includes one or more of interpreting an availability indicator for the second storage unit set, indicating unsynchronized when a time frame expires without receiving a synchronization indicator, and in accordance with a predetermination.

The method continues at block 724 where the storage units of the first storage unit set indicates that the identified encoded data slices are unsynchronized. The indicating includes at least one of updating a list of data object identifiers and updating a list of encoded data slices by storage unit. The method continues at block 726 where the storage units of the first storage unit set detect availability of the second storage unit set. The detecting includes at least one of detecting an availability indicator and interpreting a query response.

The method continues at block 728 where the storage units of the first storage unit set facilitate copying of the unsynchronized encoded data slices to corresponding storage units of the second storage unit set. The facilitating includes one or more of interpreting at least one list of unsynchronized data objects and unsynchronized encoded data slices to identify the unsynchronized encoded data slices and initiating copying of the identified unsynchronized encoded data slices from the first storage unit set to the second storage unit set.

When the copying has completed, the method continues at block 730 where the storage units of the first storage unit set indicate that the identified encoded data slices for copying are now synchronized. For example, the storage units of the first storage unit set updates the unsynchronized slice name list and the unsynchronized data object list.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a dispersed storage network (DSN) including a dispersed storage (DS) processing unit and a plurality of storage unit sets, the method comprising:
   receiving, by a first storage unit set and a second storage unit set, a plurality of sets of encoded data slices generated by the DS processing unit for storage, the plurality of sets of encoded data slices including dispersal-encoded portions of one or more data objects, wherein the first and second storage unit sets are utilized to mirror storage of the one or more data objects;
   identifying, by storage units of the first storage unit set, stored encoded data slices that are unsynchronized with the second storage unit set as unsynchronized data slices;
   generating, by the storage units of the first storage unit set, a record identifying the unsynchronized data slices;
   detecting, by the storage units of the first storage unit set, availability of at least one storage unit of the second storage unit set;
   in response to the detecting, facilitating, by the storage units of the first storage unit set, copying of particular unsynchronized data slices to corresponding storage units of the second storage unit set; and
   in response to completion of the copying, updating the record, by the storage units of the first storage unit set, to indicate that the particular unsynchronized data slices have been synchronized.

2. The method of claim 1, wherein the identifying comprises:
   interpreting an availability indicator associated with the second storage unit set.

3. The method of claim 2, wherein the interpreting comprises:
   determining the second storage unit set is unsynchronized when a time frame expires without the first storage unit set receiving a synchronization indicator.

4. The method of claim 1, further comprising:
   distributing at least a portion of a record identifying unsynchronized data slices associated with a particular storage unit to a plurality of other storage units.

5. The method of claim 1, further comprising:
   maintaining a first portion of the record at the DS processing unit; and
   maintaining second portions of the record at individual storage units.

6. The method of claim 5, wherein the facilitating includes:
   initiating synchronization of the unsynchronized data slices by particular individual storage units, based on particular second portions of the record maintained at the individual storage units.

7. The method of claim 1, wherein the generating includes generating a list of synchronized data objects.

8. The method of claim 7, further comprising:
   in response to completion of the copying, updating the list of synchronized data objects.

9. A dispersed storage network (DSN) memory comprising:
   a plurality of storage unit sets including a first storage unit set and a second storage unit set, the first and second storage unit sets configured to receive and store a plurality of sets of encoded data slices, the encoded data slices including dispersal-encoded portions of one or more data objects, wherein the first and second storage unit sets are utilized to mirror storage of the one or more data objects;
   a processor;
   memory coupled to the processor;
   a communications interface coupled to the processor and configured to communicate with the plurality of storage unit sets via a communications network;

individual storage units included in the first storage unit set configured to:
- identify, as unsynchronized data slices, stored encoded data slices that are unsynchronized with the second storage unit set;
- generate a record identifying the unsynchronized data slices;
- detect availability of at least one storage unit of the second storage unit set;
- in response to detecting availability of the at least one storage unit of the second storage unit set, facilitate copying of particular unsynchronized data slices to corresponding storage units of the second storage unit set; and
- in response to completion of the copying, update the record to indicate that the particular unsynchronized data slices have been synchronized.

10. The dispersed storage network (DSN) memory of claim 9, wherein the individual storage units are further configured to:
interpret an availability indicator associated with the second storage unit set.

11. The dispersed storage network (DSN) memory of claim 10, wherein the individual storage units are further configured to:
determine the second storage unit set is unsynchronized when a time frame expires without the first storage unit set receiving a synchronization indicator.

12. The dispersed storage network (DSN) memory of claim 9, wherein the individual storage units are further configured to:
distribute at least a portion of a record identifying unsynchronized data slices associated with a particular storage unit to a plurality of other storage units.

13. The dispersed storage network (DSN) memory of claim 9, wherein the individual storage units are further configured to:
maintain particular portions of the record at individual storage units.

14. The dispersed storage network (DSN) memory of claim 13, wherein at least one individual storage unit is further configured to:
initiate synchronization of the unsynchronized data slices, based on a particular portion of the record maintained at the at least one individual storage unit.

15. The dispersed storage network (DSN) memory of claim 9, wherein the individual storage units are further configured to:
generate a list of synchronized data objects; and
in response to completion of the copying, updating the list of synchronized data objects.

16. A dispersed storage network (DSN) comprising:
a dispersed storage (DS) processing unit implemented using a computing core, and configured to generate a plurality of sets of encoded data slices for dispersed storage, the plurality of sets of encoded data slices including dispersal-encoded portions of one or more data objects,
a plurality of storage unit sets coupled to the DS processing unit via a communications network, the plurality of storage unit sets configured to receive the plurality of sets of encoded data slices, and provide mirror storage of the one or more data objects;
individual storage units included in a first storage unit set configured to:
- identify, as unsynchronized data slices, stored encoded data slices that are unsynchronized with a second storage unit set;
- generate a record identifying the unsynchronized data slices;
- detect availability of at least one storage unit of the second storage unit set;
- in response to detecting availability of the at least one storage unit of the second storage unit set, facilitate copying of particular unsynchronized data slices to corresponding storage units of the second storage unit set; and
- in response to completion of the copying, update the record to indicate that the particular unsynchronized data slices have been synchronized.

17. The dispersed storage network (DSN) of claim 16, wherein the individual storage units are further configured to:
interpret an availability indicator associated with the second storage unit set.

18. The dispersed storage network (DSN) of claim 16, wherein the individual storage units are further configured to:
distribute at least a portion of a record identifying unsynchronized data slices associated with a particular storage unit to a plurality of other storage units.

19. The dispersed storage network (DSN) of claim 16, wherein the individual storage units are further configured to:
maintain particular portions of the record at individual storage units; and
at least one individual storage unit is further configured to initiate synchronization of the unsynchronized data slices based on particular portions of the record maintained at the at least one individual storage unit.

20. The dispersed storage network (DSN) of claim 16, wherein the individual storage units are further configured to:
generate a list of synchronized data objects; and
in response to completion of the copying, updating the list of synchronized data objects.

* * * * *